(12) United States Patent
Shih

(10) Patent No.: US 6,337,735 B1
(45) Date of Patent: Jan. 8, 2002

(54) EXPOSURE APPARATUS FOR PHOTOENGRAVING STAMPS

(76) Inventor: Shiny Shih, No. 31, Lane 349, Chungcheng S. Rd., Yungkang City, Tainan Hsien (TW)

( * ) Notice: Subject to any disclaimer, the term of this patent is extended or adjusted under 35 U.S.C. 154(b) by 0 days.

(21) Appl. No.: 09/759,271

(22) Filed: Jan. 16, 2001

(51) Int. Cl.[7] .......................... G03B 27/58; G03B 27/52; G03B 27/62; G06K 9/00
(52) U.S. Cl. .............................. 355/74; 355/40; 355/76; 382/115
(58) Field of Search .............................. 355/40, 74, 76; 385/115

(56) References Cited

U.S. PATENT DOCUMENTS 4,599,122 A * 7/1986 Nakamura ................... 156/64

* cited by examiner

Primary Examiner—Russell Adams
Assistant Examiner—Khaled Brown
(74) Attorney, Agent, or Firm—Rosenberg, Klein & Lee

(57) ABSTRACT

An exposure apparatus for photoengraving stamps includes a light-proof cabinet having a flash light therein and a drawer adapted to be drawn out therefrom. A clamp is carried on the drawer for holding the stamp. The clamp includes a base fixed to the drawer and formed with a pair of parallel rails, a pair of opposed holders movable on the base along the parallel rails, and means for moving the holders along the parallel rails in opposite directions synchronously. Each of the holders is also provided with a lifter for lifting up the middle plank between the bars and a handle for operating the lifter. Therefore the stamp may be held between the planks just under the flash light when the holders are moved closer together and the middle planks are lifted by turning the handles.

4 Claims, 8 Drawing Sheets

EXPOSURE APPARATUS FOR PHOTOENGRAVING STAMPS

BACKGROUND OF THE INVENTION

1. Field of the Invention

The present invention relates to an exposure apparatus for photoengraving stamps and, more particularly, to such an exposure apparatus in which the stamps can be positioned simply and rapidly.

2. Description of Related Art

The early method for making a stamp by photoengraving was to place a positive mask, a photosensitive film and a pad, one above another, on a glass plate of an exposure apparatus in an area just over a flash light, which then emits light to expose the film. The stamp was performed when the treated film had been developed and was adhered to a stamp body. It is obvious that the productivity is relatively low, because only one film can be treated in each exposure process.

The applicant has invented an exposure apparatus of high productivity in which one or more stamps with respective photosensitive layers can be treated simultaneously. The apparatus is shown in FIGS. 6, 7 and 8. It includes a light-proof cabinet (50) having a flash light (51) arranged therein and a drawer (52) adapted to be drawn out therefrom.

A clamp (60) is carried on the drawer (52) for holding one or more stamps (70). The clamp (60) includes a pair of opposed holders (61) which can be moved, by gearing (66), along a pair of parallel rails (65) in opposite directions in order to hold the stamps (70) therebetween or release the stamps (70) therefrom. In addition, each of the holders (61) has a bottom bar (62) for holding the stamp (70), and a top plank (64) for pressing a positive mask and a glass plate against the top face of the held stamp.

In this apparatus, however, the top planks (64) are urged downward by means of a plurality of screws (63), which must be screwed in/out respectively.

Therefore, it is an objective of the invention to provide an exposure apparatus for photoengraving stamps to mitigate and/or obviate the aforementioned problems.

SUMMARY OF THE INVENTION

The object of the present invention is to provide an exposure apparatus which has high productivity for photoengraving stamps.

Another object of the present invention is to provide an exposure apparatus which can be operated simply.

Other objects, advantages and novel features of the invention will become more apparent from the following detailed description when taken in conjunction with the accompanying drawings.

DETAILED DESCRIPTION OF THE PREFERRED EMBODIMENT

Figure 1:
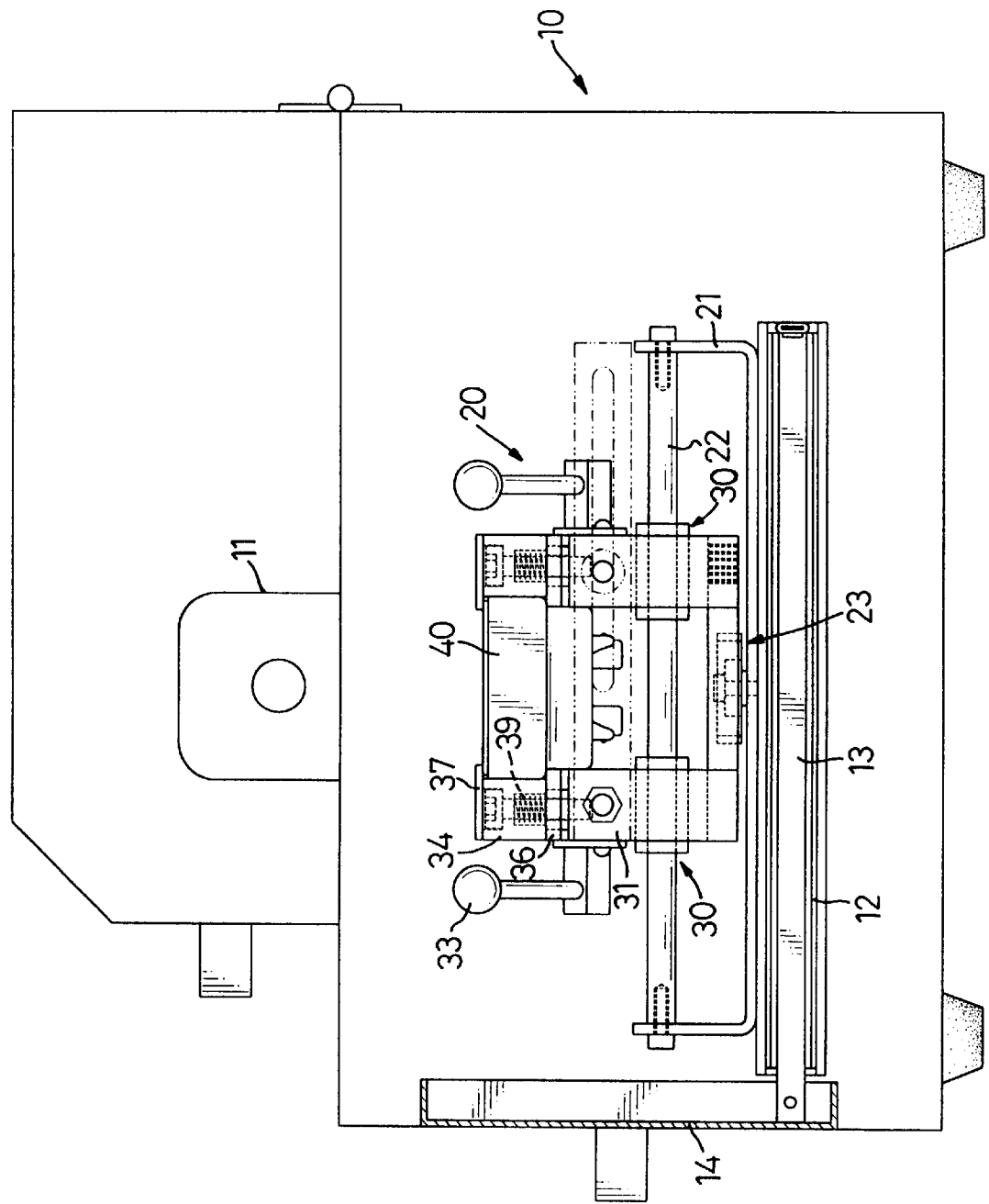
FIG. 1 is a cross-sectional view of an exposure apparatus in accordance with the present invention for photoengraving stamps.

Referring to FIG. 1, there is shown an exposure apparatus in accordance with the present invention for photoengraving at least one stamp (40).

The apparatus includes a light-proof cabinet (10) having a flash light (11) arranged therein and a drawer (12) adapted to be drawn out therefrom. The drawer (12) may be formed with a plurality of rollers (not shown) rotatable and movable along a pair of parallel tracks (13) attached to opposed inner sides of the cabinet (10). The drawer (12) preferably has a front panel (14) for covering an opening through which the drawer (12) is drawn out from the cabinet (10).

A clamp (20) is carried on the drawer (12) for holding the stamp (40). The clamp (20) includes a base (21) fixed to the drawer (12) and formed with a pair of parallel rails (22) extending horizontally, as best shown in FIG. 2.

Figure 2:
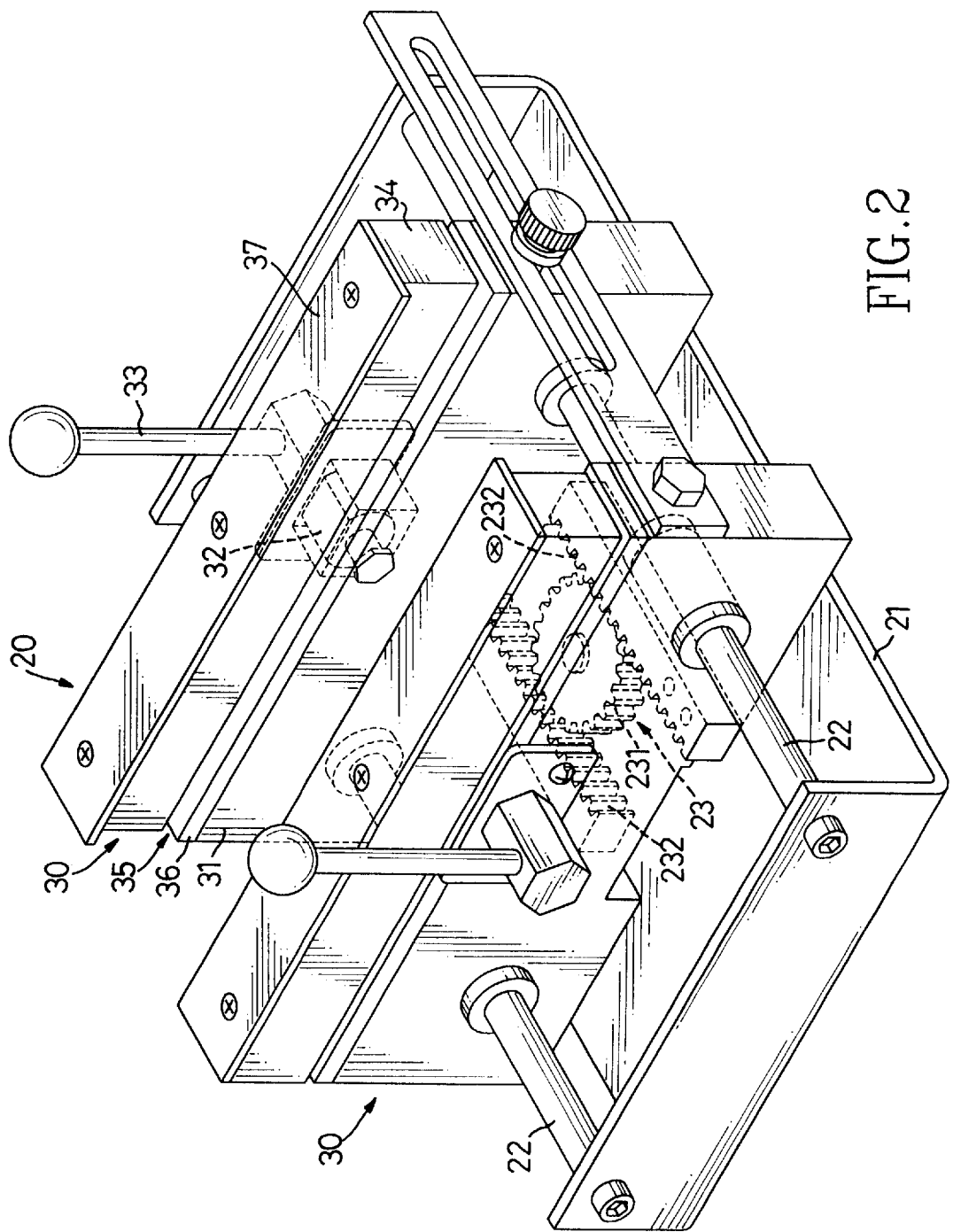
FIG. 2 is a perspective view showing a clamp included in the exposure apparatus of FIG. 1.

Referring to FIG. 2, the clamp (20) further includes a pair of opposed holders (30) movable on the base (21) along the parallel rails (22). Means (23) are provided for moving the holders (30) along the parallel rails (22) in opposite directions synchronously.

As illustrated, the means (23) may include a pinion (231) meshing with a pair of racks (232) extending from the holders (30) respectively, so that the holders (30) may be moved closer to each other to position the stamp (40) just under the flash light (11) or away from each other to release the stamp (40), as shown in FIG. 1.

Each of the holders (30) has a lower bar (31) and an upper bar (34) stationary to, but spaced from, the lower bar (31). A middle plank (36) is movable vertically in a gap (35) between the bars (31,34), and a top plank (37) is mounted atop the upper bar (34). It is important that the planks (36,37) must both extend inward from the upper bar (34).

Figure 3:
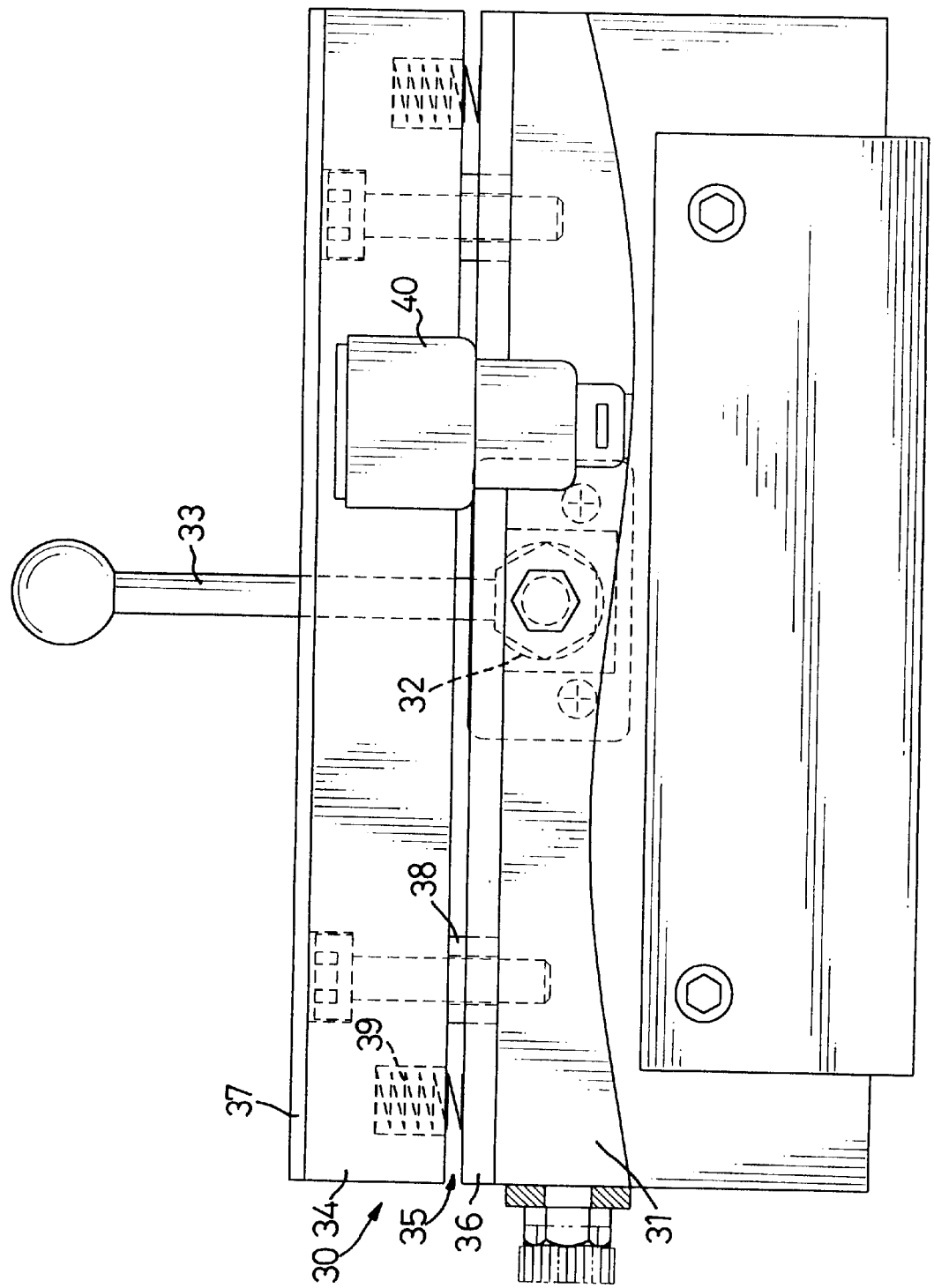
FIG. 3 is a side view, partially cut away, of the clamp shown in FIG. 2, showing a stamp in a released position.
Figure 4:
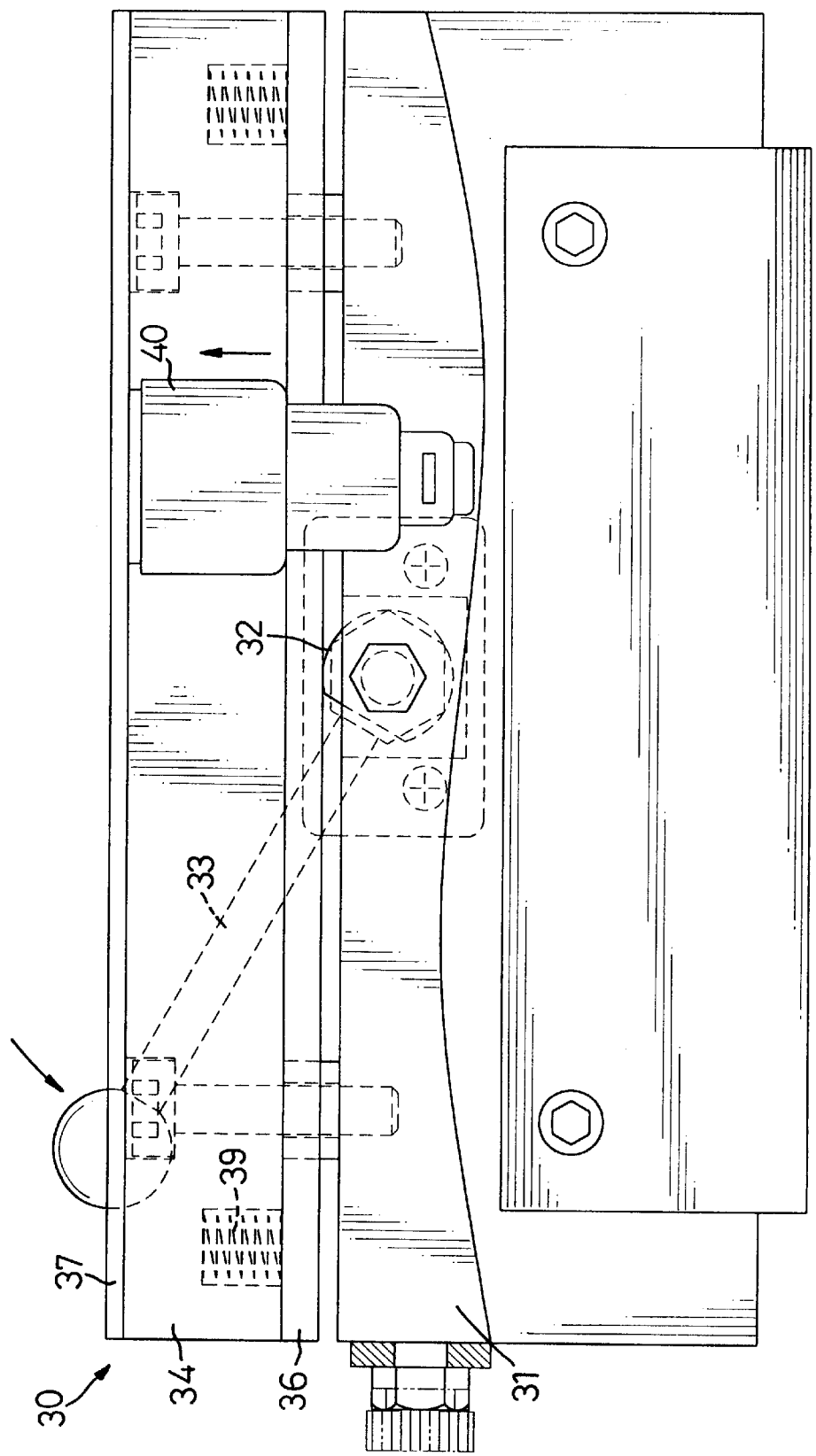
FIG. 4 is a side view, partially cut away, of the clamp shown in FIG. 2, showing the stamp in a held position.

Referring to FIGS. 3 and 4, each holder (30) is further provided with a lifter (32), such as in the configuration of a cam, that may lift up the middle plank (36) simply by the turning by an operative of a handle (33) from a position shown in FIG. 3 to another position shown in FIG. 4, so as to hold the stamp (40) between the planks (36,37).

Preferably, each holder (30) is formed with a pair of springs (39), compressed between the upper bar (34) and the middle plank (35), to lower the middle plank (35) when the stamp (40) is intended to be released and the handle (33) is returned.

Referring to FIG. 3, the bars (31,34) are spaced away from each other in an adjustable manner, preferably by a plurality of spacer sleeves (38) that are dimensioned to provide the gap (35) with an adequate height necessary for the stamp (40) to be held. The bars (31,34) may be joined to each other by means of a plurality of screws (not numbered) that extend through the spacer sleeves (38).

Figure 5:
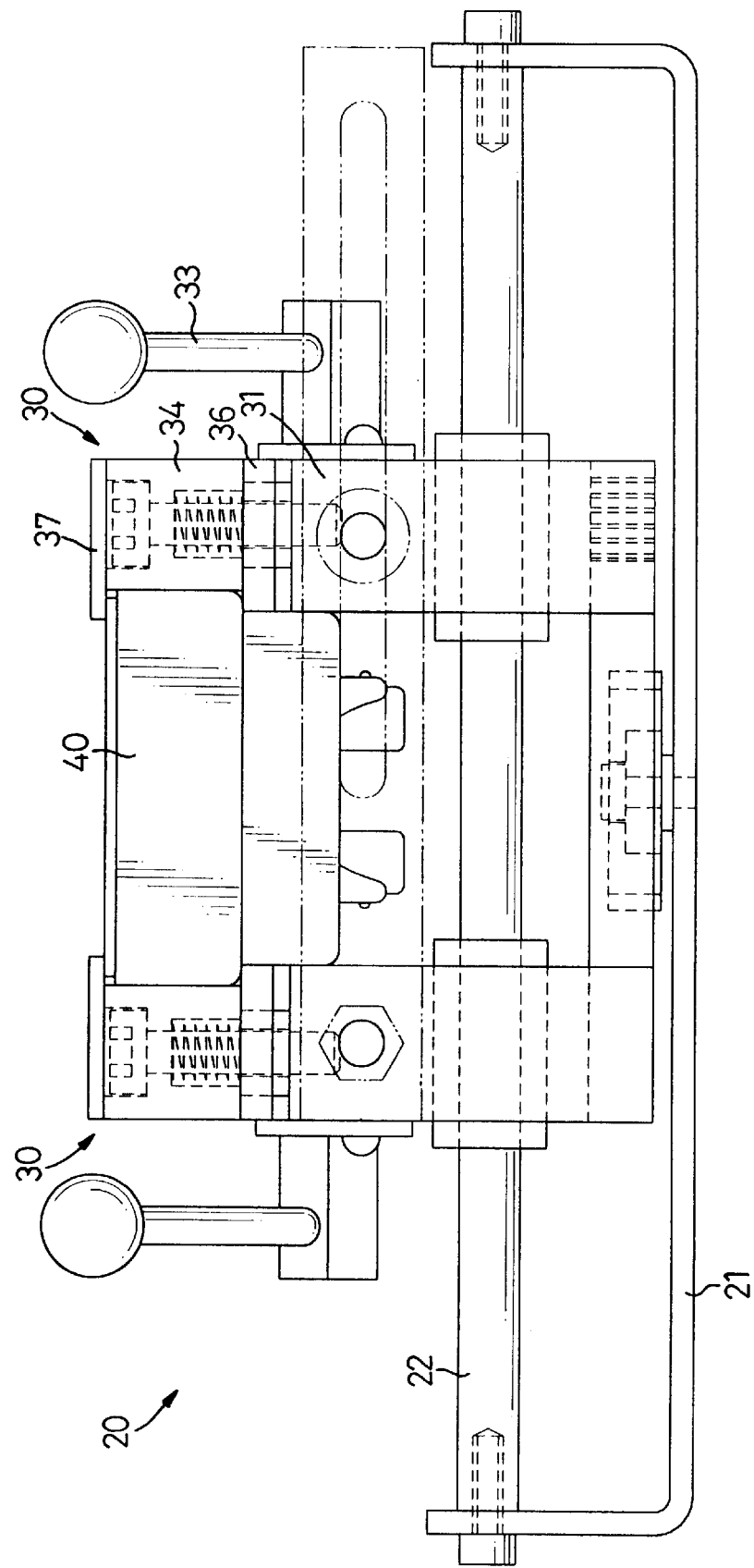
FIG. 5 is a front view of the clamp of FIG. 2, showing the stamp in the held position.
Figure 6:
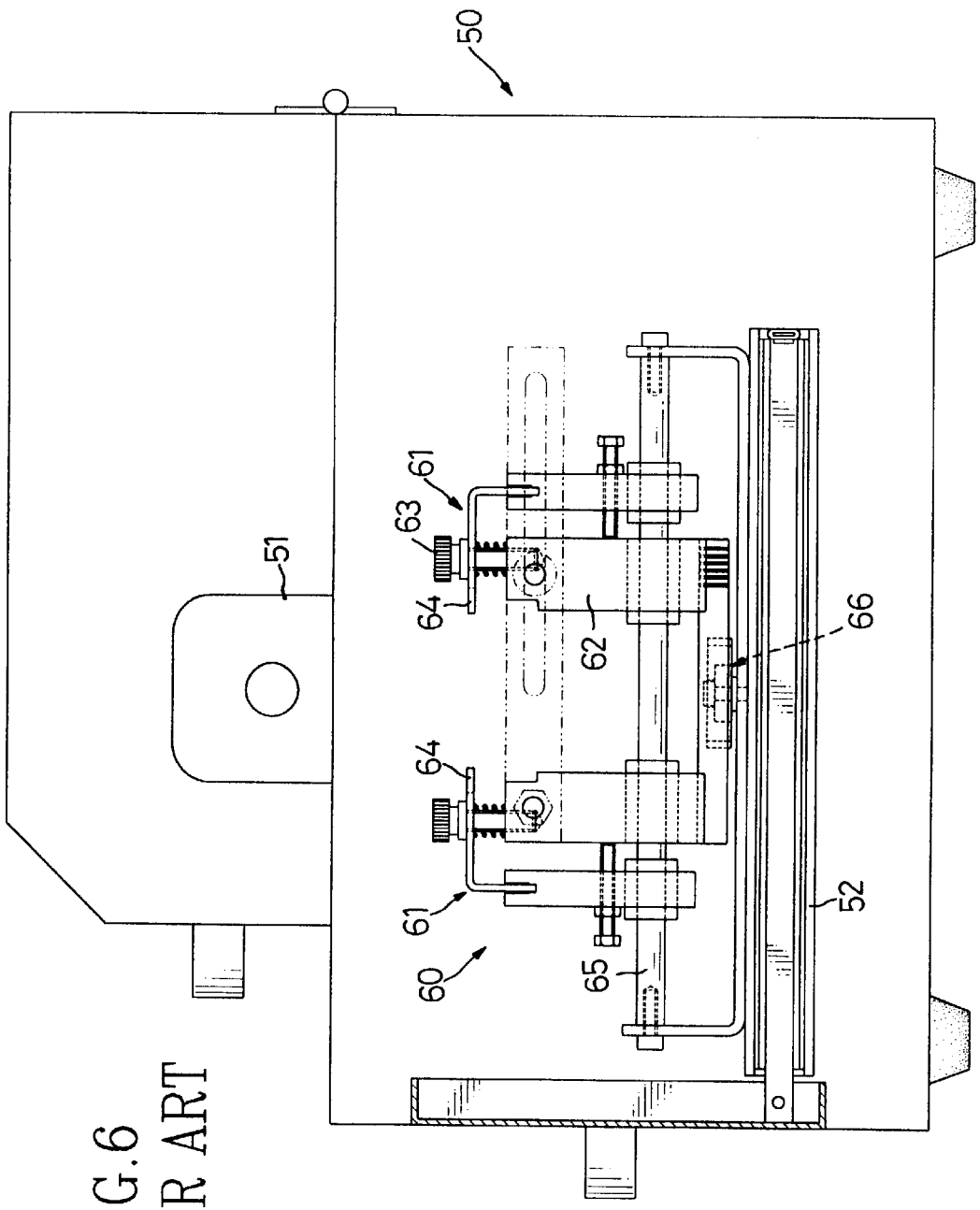
FIG. 6 is a cross-sectional view of an exposure apparatus in prior art for photoengraving stamps.
Figure 7:
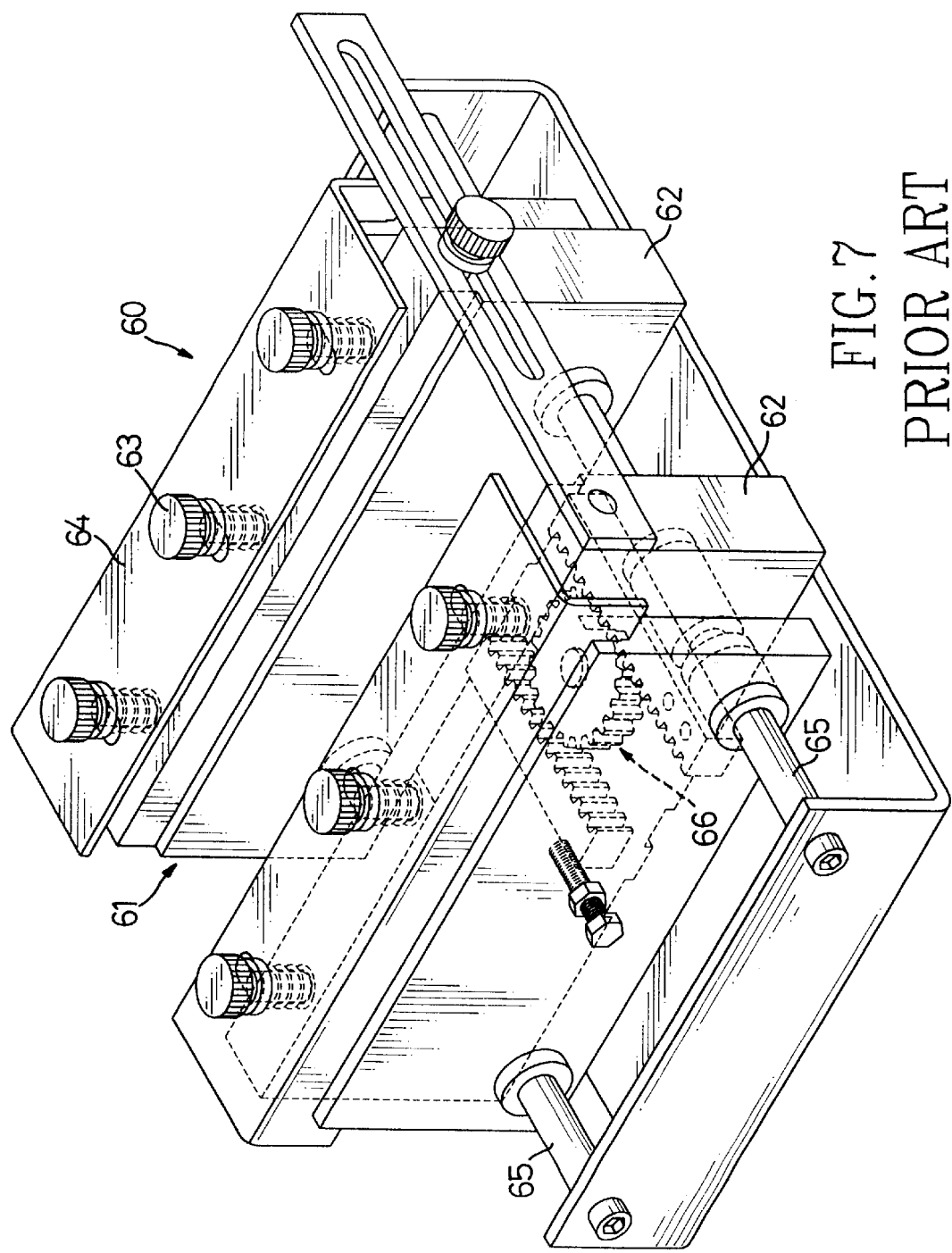
FIG. 7 is a perspective view showing a clamp included in the exposure apparatus of FIG. 6.
Figure 8:
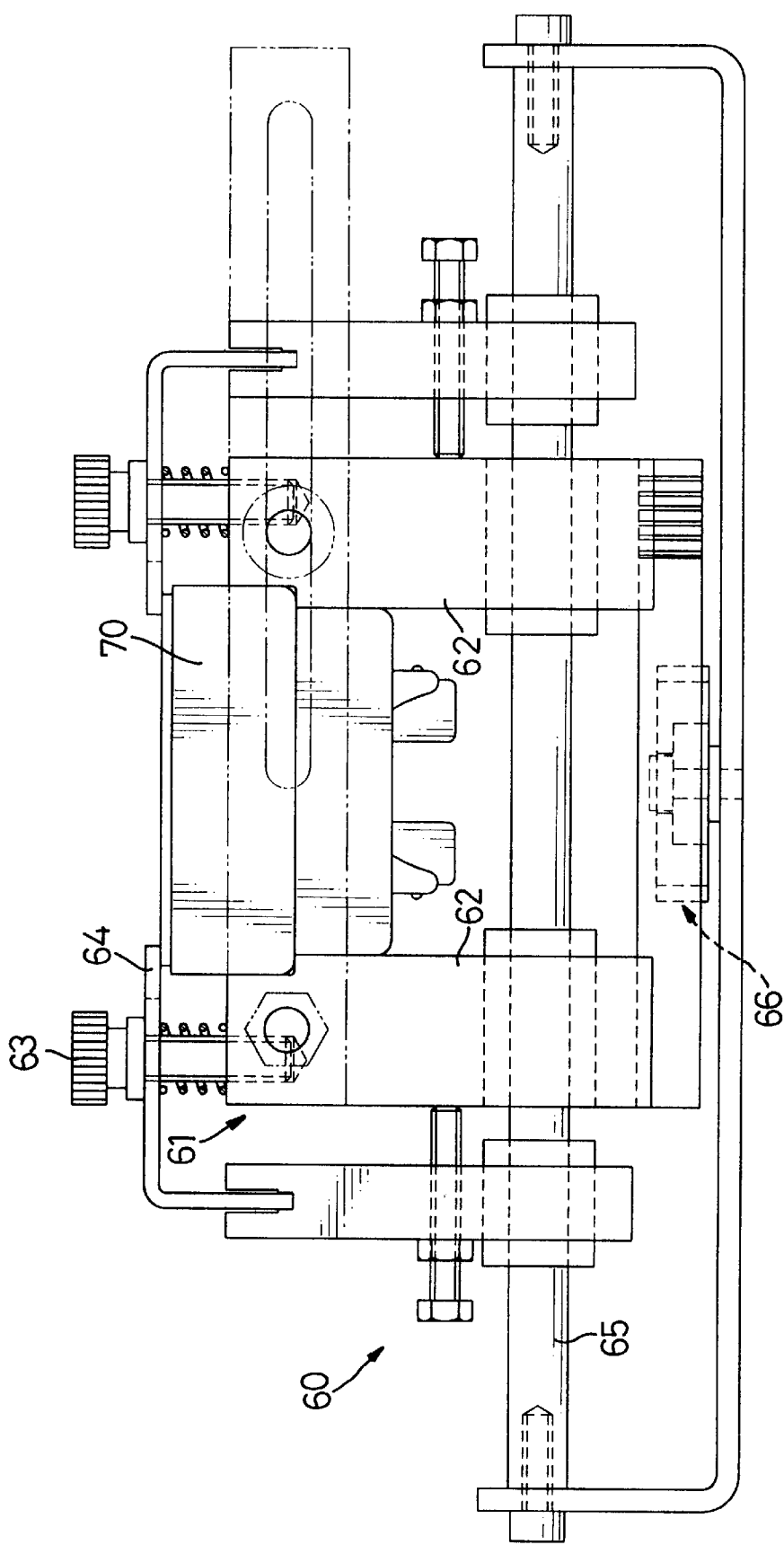
FIG. 8 is a front view of the clamp of FIG. 6, showing a stamp in a held position.

Referring to FIGS. 1 and 5, after the drawer (12) is drawn out from the cabinet (10), one or more stamp (40) of the same size can be placed between the holders (30) on the inwardly extending middle planks (36), with its photosensitive layer facing upward. The photosensitive layer is then covered with a positive mask and then a glass plate, and, optionally, a transparent sheet intervening between the layer and the mask.

The handles (33) are turned to hold the stamp (40) together with the positive mask and glass plate, as well as the transparent sheet if provided, between the top planks (37) and the lifted middle planks (36), before the drawer (12) is moved back into the cabinet (10), when, as shown in FIG. 1, the stamp (40) is ready to be exposed by light from the flash light (11) just above it.

The resulting stamp (40) can be removed after the drawer (12) is drawn out again. By turning the handles (33) and, particularly, moving the holders (30) away from each other, the one or more stamp (40) can be removed easily from the clamp (20).

From the above description, it is noted that the invention has the following advantages:

1. High Productivity

Because one or more stamp (40) can be held and treated at the same time, productivity of the exposure procedure is highly improved in comparison to prior art devices.

2. Simplified Operation

Because the stamp (40) can be held between the planks (36,37) only by turning the handles (33), the operation is simple and rapid.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An exposure apparatus for photoengraving a stamp (40), the apparatus having a light-proof cabinet (10) with a flash light (11) therein and a drawer (12) adapted to be drawn out therefrom, and a clamp (20) carried on said drawer (12) for holding said stamp (40), said clamp (20) comprising:
   a base (21) fixed to said drawer (12) and formed with a pair of parallel rails (22);
   a pair of opposed holders (30) movable on said base (21) along said parallel rails (22);
   means (23) for moving said holders (30) along said parallel rails (22) in opposite directions synchronously;
   each of said holders (30) having a lower bar (31), an upper bar (34) stationary to and spaced from said lower bar (31), a middle plank (36) movable vertically between said bars (31,34) and a top plank (37) atop said upper bar (34), said planks (36,37) extending inward from said upper bar (34);
   each of said holders (30) being provided with a lifter (32) for lifting up said middle plank (36) between said bars (31,32) and a handle (33) for operating said lifter (32); whereby said stamp (40) may be held between said planks (36,37) just under said flash light (11) when said holders (30) are moved closer together and said middle planks (36) are lifted by turning said handles (33).

2. The exposure apparatus as claimed as claim 1, wherein said upper bar (34) is spaced from said lower bar (31) by means of spacer sleeves (38), and wherein said bars (31,34) are joined to each other by screws extending through said spacer sleeves (38).

3. The exposure apparatus as claimed as claim 1, wherein each of said holders (30) further includes at least one spring (39) compressed between said upper bar (34) and said middle plank (35).

4. The exposure apparatus is claimed as claim 1, wherein said lifter (32) is configured as a lifter cam.

* * * * *